United States Patent
Kwon et al.

(10) Patent No.: US 7,074,704 B2
(45) Date of Patent: Jul. 11, 2006

(54) BUMP FORMED ON SEMICONDUCTOR DEVICE CHIP AND METHOD FOR MANUFACTURING THE BUMP

(75) Inventors: Yong-hwan Kwon, Kyungki-do (KR); Sa-yoon Kang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/860,536

(22) Filed: Jun. 2, 2004

(65) Prior Publication Data

US 2004/0219715 A1 Nov. 4, 2004

Related U.S. Application Data

(62) Division of application No. 10/426,155, filed on Apr. 29, 2003, now abandoned.

(30) Foreign Application Priority Data

May 17, 2002 (KR) ................................ 2002-27440

(51) Int. Cl.
*H01L 21/44* (2006.01)
*H01L 23/52* (2006.01)

(52) U.S. Cl. ....................... 438/613; 438/612; 257/737

(58) Field of Classification Search ................ 438/612, 438/613, 614, 615; 228/180.22; 257/737
See application file for complete search history.

(56) References Cited

U.S. PATENT DOCUMENTS

| | | | |
|---|---|---|---|
| 5,418,186 A * | 5/1995 | Park et al. | 438/614 |
| 5,656,863 A | 8/1997 | Yasunaga et al. | |
| 6,225,206 B1 * | 5/2001 | Jimarez et al. | 438/616 |
| 6,245,594 B1 * | 6/2001 | Wu et al. | 438/108 |
| 6,281,046 B1 * | 8/2001 | Lam | 438/113 |
| 6,424,036 B1 * | 7/2002 | Okada | 257/734 |
| 6,809,421 B1 * | 10/2004 | Hayasaka et al. | 257/777 |
| 2001/0008310 A1 * | 7/2001 | Sakuyama et al. | 257/737 |
| 2001/0040290 A1 * | 11/2001 | Sakurai et al. | 257/737 |
| 2002/0011655 A1 | 1/2002 | Nishiyama et al. | |
| 2002/0048924 A1 | 4/2002 | Lay et al. | |
| 2003/0013291 A1 * | 1/2003 | Chen et al. | 438/613 |

* cited by examiner

*Primary Examiner*—Carl Whitehead, Jr.
*Assistant Examiner*—Deloris Bryant
(74) *Attorney, Agent, or Firm*—Marger Johnson & McCollom,P.C.

(57) ABSTRACT

A bump of a semiconductor chip comprises a plurality of bond pads formed on a semiconductor chip, a conductive bump formed on the bond pads; and a sidewall insulating layer formed on sidewalls of the conductive bump. It is possible for the semiconductor chip to prevent electrical shorts and improve productivity even though a pitch of bond pad is decreased.

18 Claims, 5 Drawing Sheets

BUMP FORMED ON SEMICONDUCTOR DEVICE CHIP AND METHOD FOR MANUFACTURING THE BUMP

This application is a divisional of U.S. patent Ser. No. 10/426,155 filed on Apr. 29, 2003, now abandoned, which is herein incorporated by reference in its entirety.

BACKGROUND OF THE INVENTION

1. Field of the Invention

The present invention relates to a semiconductor device, and more particularly, to a bump of a semiconductor chip, a method for manufacturing the bump, and a package using the bump.

2. Description of the Related Art

As semiconductor devices become more highly integrated, the number of pads formed on the surface of a semiconductor chip increase, while the pitch between the metal pads becomes narrow. This causes various problems when the semiconductor chip is mounted on a printed circuit board (PCB).

In particular, when packaging a semiconductor chip using a chip-on-glass (COG) method, it is very difficult to reduce the pitch between the metal pads because of possible electrical shorts therebetween, as the pitch between bumps formed on the metal pad becomes narrower.

FIG. 11 is a cross-sectional view showing a conventional bump of a semiconductor chip, and FIG. 12 is a cross-sectional view of a semiconductor device mounted on a PCB with the COG method. Referring to FIGS. 11 and 12, the conventional semiconductor chip bump comprises bump metal layers 1220 and 1230 formed of a metal compound on a metal pad 1180 which is formed on a semiconductor chip 1100 in order to protrude upward with a predetermined height. Here, the reference number 1190 denotes a passivation film, which acts as a protective layer.

When the conventional semiconductor chip 1100 is mounted on a PCB 1400 through the COG method, as shown in FIG. 12, adjacent bump metal layers 1220 and 1230 become very close to each other within a critical distance. Consequently, the anisotropic conductive layer 1350 loses its role as an insulating layer and is likely to be shorted. Therefore, there are limits to which the pitch between the metal pads 1180 formed on the semiconductor device can be reduced, in designing the bump pitches using the COG method. Accordingly, the conventional bump structure has become more and more unsuitable for use in highly-integrated semiconductor chips.

SUMMARY OF THE INVENTION

To solve the above-described problems, it is an object of the present invention to provide a semiconductor chip bump that does not cause electrical shorts when it is mounted on a PCB or a package substrate, even when the interval between the bond pads formed on the semiconductor chip becomes narrow, and a method for manufacturing the same.

According to one embodiment, a bump of a semiconductor chip comprises a plurality of bond pads formed on a semiconductor chip, a conductive bump or a metal bump formed on the bond pads; and a sidewall insulating layer formed on sidewalls of the conductive bump.

According to another embodiment, an insulating layer is formed on a semiconductor chip on which a plurality of bond pads are formed. A contact hole is formed in the insulating layer to expose the bond pads. Thereafter, a bump is formed in the contact hole, and a sidewall insulating layer is formed on the sidewalls of the bump.

The insulating layer is preferably formed of a polymer material. A polymer material such as a polymide precursor is coated on the surface of a semiconductor substrate with, for example, a spin coating method and is thermally processed for a predetermined time so that a solid polymer layer is formed.

According to one embodiment, the contact hole is formed in the polymer layer using laser to expose the bond pads. Alternatively, the contact hole can also be formed by dry etching using plasma.

According to one aspect of the present invention, forming a metal bump includes forming a seed metal on the exposed metal pad using, for example, non-electrolytic plating, forming on the seed metal a metal packing layer of nickel or nickel alloy, and filling the inside of the contact hole to a predetermined height. The capping metal layer is formed on the metal packing layer. The capping metal layer is preferably formed of gold (Au).

The method of forming the sidewall insulating layer on the sidewall of the metal pump includes etching the polymer layer to a desired amount by, for example, irradiating laser while leaving a portion of the polymer layer on the sidewalls of the bump.

As described above, the bump of a semiconductor chip of the present invention and a method for manufacturing the same can prevent shorts, even when the interval between the bond pads becomes narrow as the line width of the semiconductor chip becomes narrow because the sidewall of the bump is surrounded by an insulating layer and electrically insulated.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

The present invention will now be described more fully with reference to the accompanying drawings, in which preferred embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
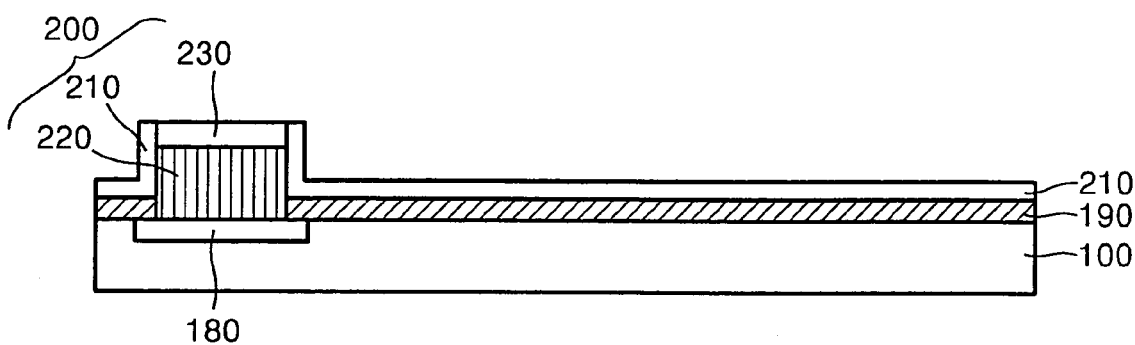
FIG. 1 is a cross-sectional view of a bump formed on a semiconductor chip of the present invention.

FIG. 1 is a cross-sectional view showing a bump 200 formed on a semiconductor chip 100 according to an embodiment of the present invention. Referring to FIG. 1, the bump 200 formed on the semiconductor chip 100 comprises a plurality of bond pads 180 formed on the surface of the semiconductor chip 100, bump metal layers 220 and 230 overlying and electrically connected to the bond pads 180. The bump 200 includes a sidewall insulating layer 210 surrounding the sidewalls of the bump metal layers 220 and 230. Here, reference number 190 denotes a passivation layer formed on the semiconductor chip as a protection layer.

It is not shown, but the metal pad 180 is formed along a periphery of the semiconductor chip 100 at a predetermined interval so that individual memory or the LOGIC devices formed in the semiconductor chip 100 can be electrically connected to an external device such as PCB. The predetermined interval corresponds to the connecting pads (not shown) formed on the PCB on which the semiconductor chip 100 is mounted.

The bump 200 preferably comprises a packing metal layer 220 contacting the metal pad 180, and a capping metal layer 230 stacked on the packing metal layer 220. The packing metal layer 220 preferably comprises a metal material having good contact resistance and bonding properties with the metal pad 180, for example, Nickel Ni or Nickel alloy. Also, the capping metal layer 230 is preferably formed of gold. One skilled in the art will appreciate that other suitable conductive materials to form the packing metal layer 220 or the capping metal layer 230 can be used within the spirit and scope of the present invention.

The sidewall insulating layer 210 is formed on sidewalls of the bump metal layers 220 and 230, and formed of an insulating film such as polyamide or epoxy which is a type of polymer resin. The sidewall insulating layer 210 can prevent electrical shorts between the bumps 200 during a back-end packaging process like resin filling. Also, damage to the bump metal layers 220 and 230 can be prevented by minimizing an area of the bump metal layers 220 and 230 exposed to the outside.

Figure 9:
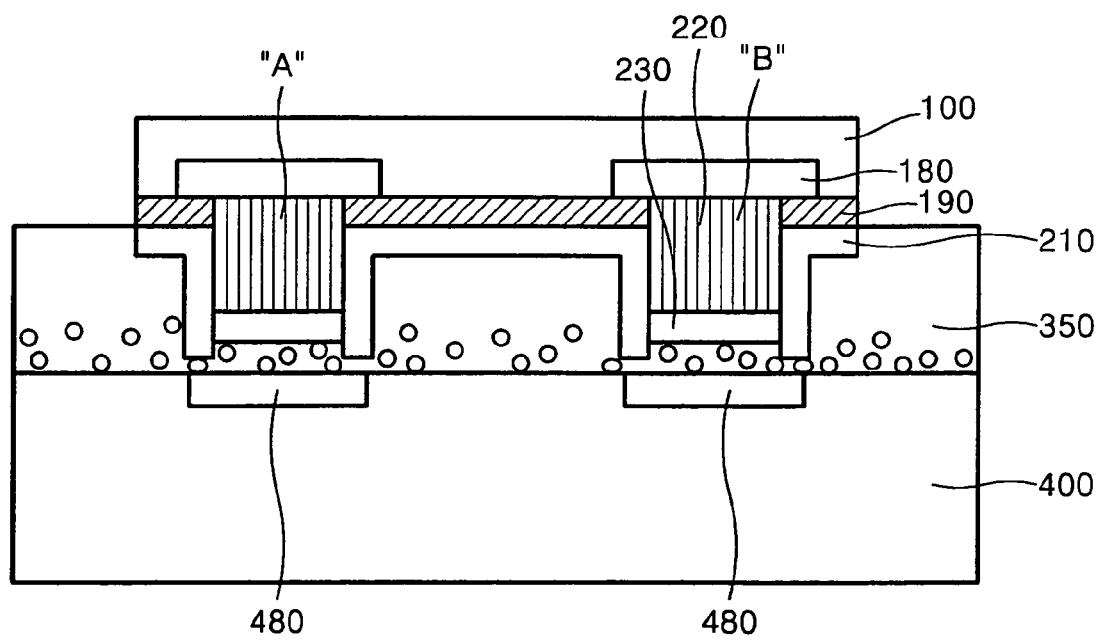
FIG. 9 is a cross-sectional view showing a COG package of a semiconductor chip of the present invention.
Figure 10:
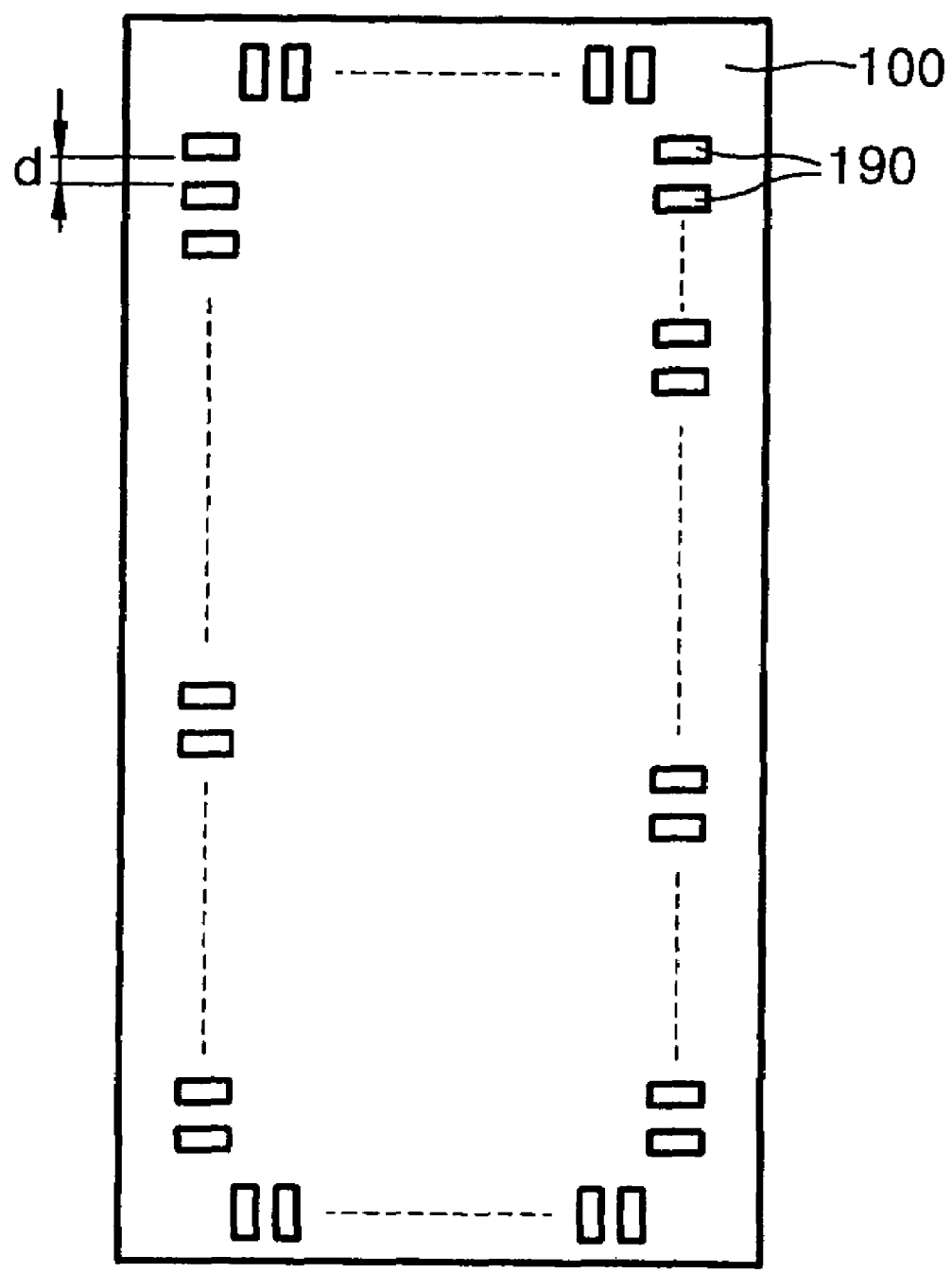
FIG. 10 is a schematic plane view showing an array of bond pads formed on the semiconductor chip.
Figure 11:
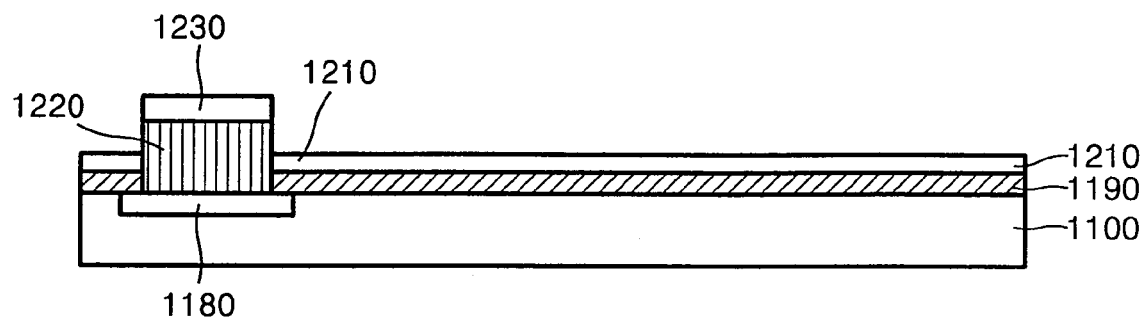
FIG. 11 is a cross-sectional view showing a bump of a conventional semiconductor chip.
Figure 12:
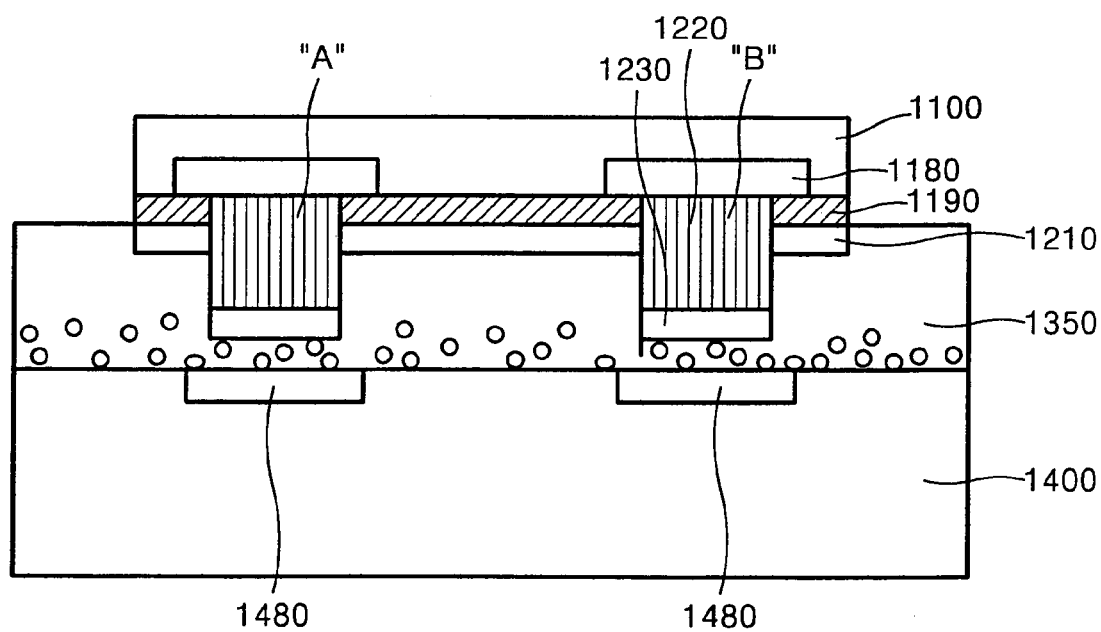
FIG. 12 is a cross-sectional view showing a COG package of a conventional semiconductor chip.

As shown in FIG. 9, when the semiconductor chip 100 is mounted on a PCB 400 by a COG method, an anisotropic conductive film 350 can be used to connect the semiconductor chip 100 to connection pads 480 formed on the PCB 400. The anisotropic conductive film 350 has both conductive characteristics, because of conductive particles formed therein, and insulation characteristics, when the conductive particles are separated from each other more than a predetermined distance. However, if the distance between the adjacent bump metal layers 220 and 230 becomes too narrow, i.e., narrower than a critical distance between the adjacent bump metal layers 220 and 230, the sidewall insulating layer 210 formed on the sidewalls of the bump metal layers 220 and 230 acts as an insulator and prevents short circuits therebetween.

Figure 2:
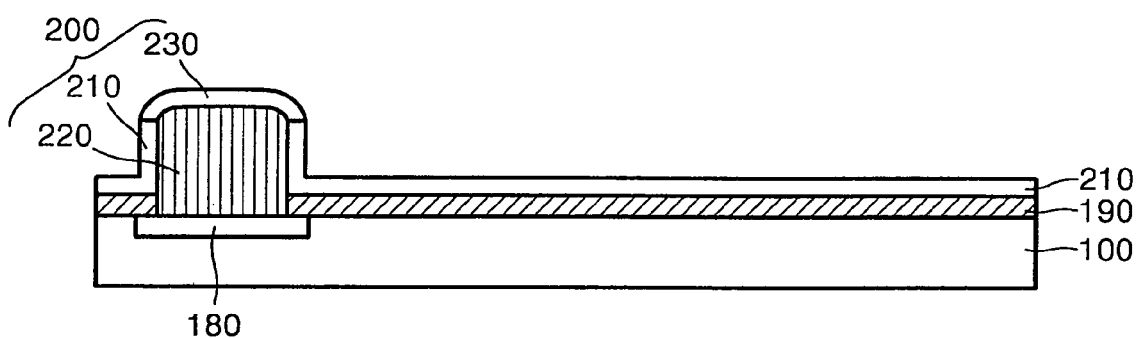
FIG. 2 is a cross-sectional view of another embodiment of the bump formed on a semiconductor chip of the present invention.

FIG. 2 is a cross-sectional view showing a bump of a semiconductor chip according to another embodiment of the present invention. Referring to FIG. 2, a bump 200 includes a packing metal layer 220 formed within a sidewall insulating layer 210 and slightly exceeds the upper portion of the sidewall insulating layer 210. A capping metal layer 230 is formed to cover the top of the packing metal layer 220. The bump metal layers 220 and 230 having the above configuration are formed to protrude onto the sidewall insulating layer 210 to have a width greater than the capping metal layer 230 of FIG. 1. Thus, the bump 200 can easily contact the outer coupling pad (not shown) and have a low contact resistance due to a broad contact area therebetween.

FIGS. 3 through 6 are cross-sectional views sequentially showing a method of manufacturing a bump formed on a semiconductor chip according to an embodiment of the present invention.

Figure 3:
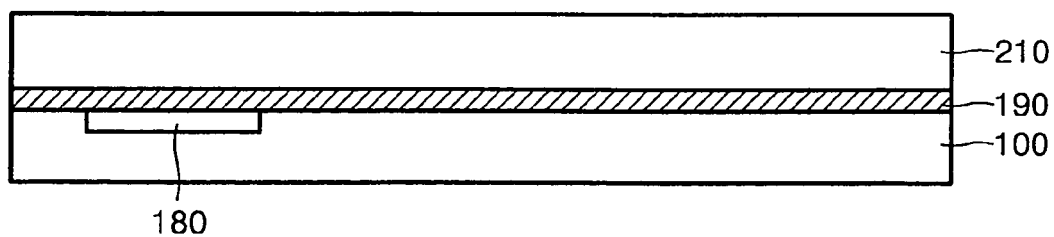
FIGS. 3 through 6 are cross-sectional views showing a sequence of steps in a method for manufacturing the bump formed on a semiconductor chip of the present invention.

Referring to FIG. 3, a polymer material is coated on a semiconductor chip 100, including a passivation layer 190, on which a semiconductor device is fabricated through a predetermined manufacturing process. The semiconductor chip 100 may then be thermally treated by a method such as baking in a baking oven at a predetermined temperature. Consequently, a polymer layer 210 is disposed over the semiconductor substrate 100 to form a sidewall insulating layer 210. See FIG. 6. The polymer material layer 210 may be, but not limited to, polymide or epoxy.

Figure 4:
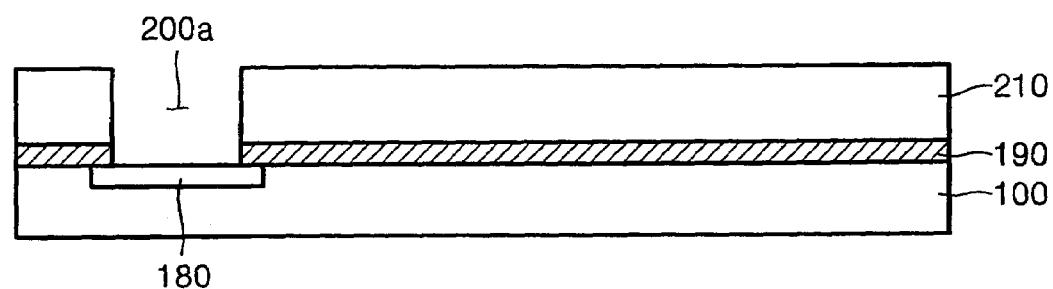

Referring to FIG. 4, a contact hole 200a is formed in the polymer layer 210 to expose the surface of the metal pad 180 through a predetermined patterning process. The contact hole 200a may be formed, for example, by irradiating a laser on a portion where the metal pad needs to be exposed. In addition, in the case of a photoresist polymer, a contact pattern for exposing the metal pad 180 is formed by coating a photoresist on the surface of the semiconductor chip 100 and aligning/exposing the same. The contact hole 200a for exposing the metal pad 180 is formed by etching the passivation layer 190 by dry etching using the patterned photoresist as a mask.

Figure 5:
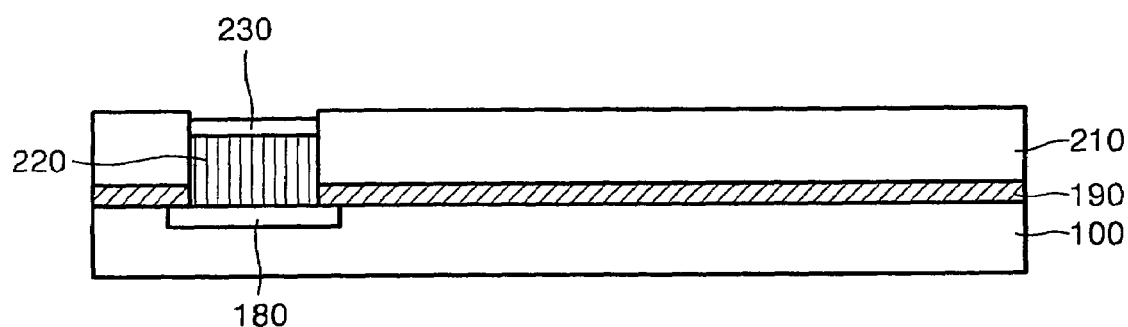

Referring to FIG. 5, a seed metal (not shown) is formed on the surface of the exposed metal pad 180 inside the contact hole 200a, and a packing metal layer 220 is formed preferably using non-electrolytic plating. It is preferred that the packing metal layer 220 be formed of nickel or nickel ally because it has low contact resistance and good adhesion properties with aluminum that forms the metal pad 180. Next, a capping metal layer 230, preferably formed of gold (Au), is formed on the packing metal layer 220. The packing metal layer 220 is preferably formed shallower than the depth of the contact hole 200a. Even though the capping metal layer 230 is formed on the packing metal layer 220, it is possible to leave a recessed area in the center of contact hole 200a because the contact hole 200a is lower than the neighboring sidewall insulating layer 210. Accordingly, it is convenient to attach an external connection terminal such as a solder ball on the bump 200.

Figure 6:
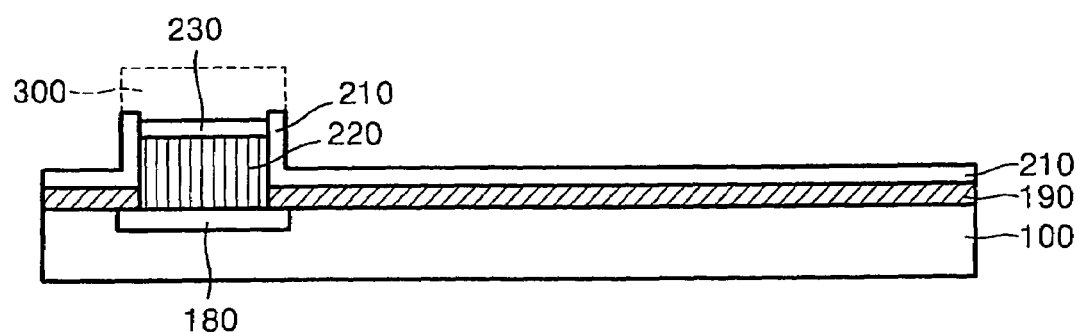

Referring to FIG. 6, a photoresist is coated and patterned on the surface of a semiconductor chip 100 to form a sidewall insulating layer pattern 300. The portions of the polymer layer 210 can be removed by, for example, laser irradiation. Consequently, the sidewall insulating layer 210' is formed to remain on the sidewalls of the bump metal layers 220 and 230 and the other portions of the polymer layer 210 can be removed.

With the method described above, the polymer layer 210 is etched to leave a portion of the polymer layer 210 on the passivation layer 190 to a predetermined thickness, for example, 2–5 microns to serve as a protection layer. Alternatively, the polymer layer 210 is removed to expose the passivation film 190. Thus, the laser irradiation method has an advantage in that the thickness of the polymer layer 210 can be precisely controlled through pulses.

Figure 7:
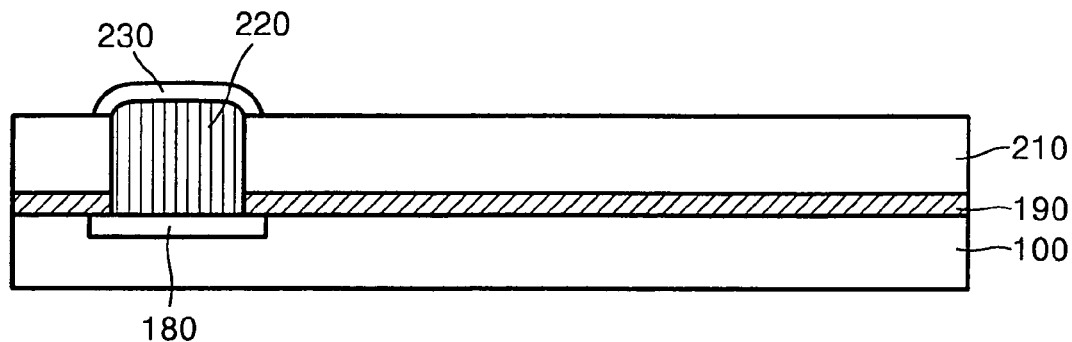
FIGS. 7 and 8 are cross-sectional views showing another embodiment of the method for manufacturing the bump formed on a semiconductor chip of the present invention.
Figure 8:
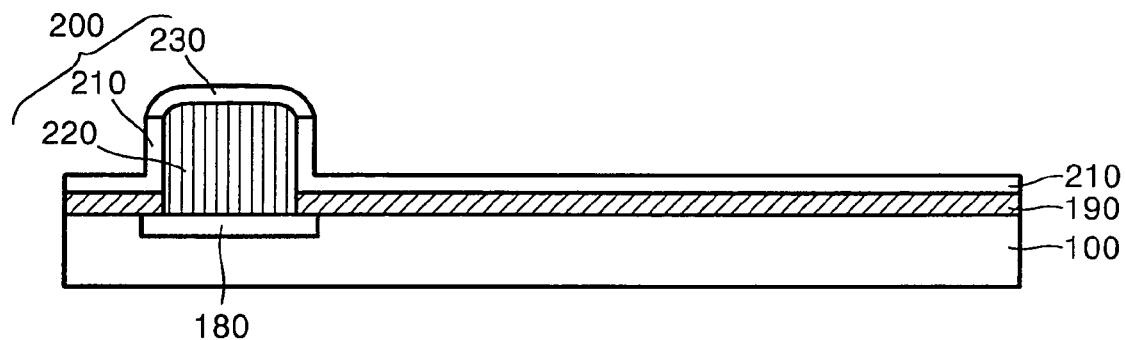

FIGS. 7 and 8 are cross-sectional views showing another embodiment of the method for manufacturing a bump of a semiconductor chip of the present invention.

Referring to FIG. 7, after a contact hole 200a is formed in a polymer layer 210, a seed metal is formed within the contact hole 200a on a metal pad 180. Then, a packing metal layer 220 is formed in the contact hole 200a using non-electrolytic plating in the same manner as described with respect to FIG. 5. The packing metal layer 220 is grown having a flange shape on side walls of the sidewall insulating layer 220 in the contact hole 200a. The packing conductive layer 220 is overgrown to the outside of the contact hole 200a. Next, a capping metal layer 230, preferably formed of gold (Au), is formed on the packing conductive layer 220. A sidewall insulating layer 210 is etched using the capping metal layer as a mask through, for example, dry etching.

The method for manufacturing a bump having the above described configuration has an advantage of reducing manufacturing costs by omitting a photo process.

Thus, the present invention provides a semiconductor chip bump that can reduce electrical shorts between bump metal layers especially in a highly integrated circuit.

FIG. 9 is a cross-sectional view of a COG package in which a bump of a semiconductor chip is attached to a PCB by a COG method. Referring to FIG. 9, the COG package according to an embodiment of the present invention comprises a PCB 400 on which a plurality of connection pads 480 are formed; a semiconductor chip including a plurality of bond pads 180 formed to face the PCB 400 and correspond to the connection pads 480, bump metal layers 220 and 230 overlying the metal pad 180, and an insulating layer 210' formed on the sidewalls of the bump metal layers; and an anisotropic conductive film 350 interposed between the PCB 400 and the semiconductor chip 100 and electrically connecting the connection pads 480 and the bump metal layers 220 and 230.

The insulating layer 210' is preferably formed of a polymer such as polymide or epoxy, using a spin coating method. The anisotropic conductive film 350 including conductive particles is conductive at the portion where the connection pad 480 and the bump metal layer 230 contact, and acts as an insulating layer at other portions.

According to embodiments of the present invention, electrical shorts do not occur in the COG package because the sidewall of the bump metal layer A is surrounded by the insulating layer 210' and electrically insulated, even though the distance from other bump metal layers B becomes narrower, or even when the pitch between bond pads becomes narrow.

In addition, the method for manufacturing a semiconductor chip of the present invention can reduce production costs by omitting a photo process. Furthermore, the method for manufacturing a semiconductor chip of the present invention can reduce soldering fails by forming a solder ball on the bump metal layer in a stable manner.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for manufacturing a semiconductor chip, the method comprising;
   forming an insulating layer on a semiconductor chip having a plurality of bond pads formed thereon, wherein the insulating layer is not a photoresist layer;
   forming a contact hole in the insulating layer to expose the bond pads;
   forming a bump conductive layer in the contact hole; and
   removing a predetermined portion of the insulating layer while leaving a top portion of the insulating layer adjacent to the bump conductive layer un-etched so that a vertical portion and a horizontal portion of the insulating layer remain on sidewalls of the bump conductive layer and the substrate, respectively, the vertical portion being a sidewall insulating layer.

2. The method of claim 1, wherein the insulating layer comprises a polymer material.

3. The method of claim 2, wherein the polymer material is one of polymide or epoxy.

4. The method of claim 1, wherein the forming a contact hole in the insulating layer comprises etching a portion of the insulating layer using laser irradiation.

5. The method of claim 1, wherein the forming a bump conductive layer in the contact hole comprises:
   forming a seed metal on the exposed bond pads;
   forming a metal packing layer on the seed metal; and
   forming a capping metal layer on the metal packing layer.

6. The method of claim 5, wherein the metal packing layer is formed of nickel Ni or nickel alloy.

7. The method of claim 5, wherein the capping metal layer is formed of gold (Au).

8. The method of claim 5, further comprising forming a solder ball on the capping metal layer.

9. The method of claim 1, wherein the forming a sidewall insulating layer on sidewalls of the bump conductive layer comprises:
   forming a photoresist pattern overlying the bump conductive layer; and
   etching the insulating layer to leave a portion of the insulating layer on the sidewalls of the bump conductive layer to form the sidewall insulating layer, using the photoresist pattern as a mask.

10. The method of claim 9, wherein the etching comprises laser irradiation.

11. The method of claim 1, wherein the forming a sidewall insulating layer on sidewalls of the bump conductive layer by removing a portion of the insulating layer comprises:
   over growing the bump conductive layer on a top of the insulating layer to a predetermined height; and
   etching the insulating layer using the overgrown bump conductive layer as a mask.

12. The method of claim 11, wherein the overgrowing the bump conductive layer comprises:
   forming a seed metal in the contact hole;
   growing a metal packing layer on the seed metal and growing the metal packing layer to extend above the contact hole to a predetermined amount; and
   forming a capping metal layer on the metal packing layer.

13. The method of claim 12, wherein the metal packing layer is formed of nickel or nickel alloy.

14. The method of claim 11, wherein the etching comprises laser irradiation.

15. The method of claim 1, wherein no portion of the bump conductive layer is formed above the ton of the contact hole.

16. The method of claim 1, wherein the bump conductive layer extends completely within an inner sidewall of the sidewall insulating layer.

17. A method for manufacturing a semiconductor chip, the method comprising:
   forming an insulating layer on a semiconductor chip having a plurality of bond pads formed thereon, wherein the insulating layer is not a photoresist layer;
   forming a contact hole in the insulating layer to expose the bond pads;

forming a bump conductive layer in the contact hole; and removing a portion of the insulating layer so that a vertical portion and a horizontal portion of the insulating layer remain on sidewalls of the bump conductive layer and the substrate, respectively, the vertical portion being a sidewall insulating layer, wherein the horizontal and vertical portions together form an L-shape structure.

18. A method for manufacturing a semiconductor chip, the method comprising;

forming an insulating layer on a semiconductor chip having a plurality of bond pads formed thereon, wherein the insulating layer is not a photoresist layer;

forming a contact hole in the insulating layer to expose the bond pads;

forming a bump conductive layer in the contact hole; and forming a sidewall insulating layer pattern on the bump conductive layer, wherein the sidewall insulating layer pattern extends beyond the bump conductive layer onto a first portion of the insulating layer; and removing a second portion of the insulating layer, using the sidewall insulating layer pattern as a mask, so that the first portion, being a vertical portion, and a horizontal portion of the insulating layer remain on sidewalls of the bump conductive layer and the substrate, respectively.

* * * * *

UNITED STATES PATENT AND TRADEMARK OFFICE
CERTIFICATE OF CORRECTION

PATENT NO. : 7,074,704 B2  Page 1 of 1
APPLICATION NO. : 10/860536
DATED : July 11, 2006
INVENTOR(S) : Yong-hwan Kwon et al.

It is certified that error appears in the above-identified patent and that said Letters Patent is hereby corrected as shown below:

Column 6, line 56, the word "ton" should read -- top --.

Signed and Sealed this

Eleventh Day of August, 2009

David J. Kappos
*Director of the United States Patent and Trademark Office*